US007517736B2

(12) United States Patent
Mehta et al.

(10) Patent No.: US 7,517,736 B2
(45) Date of Patent: Apr. 14, 2009

(54) STRUCTURE AND METHOD OF CHEMICALLY FORMED ANCHORED METALLIC VIAS

(75) Inventors: Sanjay C. Mehta, Poughkeepsie, NY (US); Daniel C. Edelstein, White Plains, NY (US); John A. Fitzsimmons, Poughkeepsie, NY (US); Stephan Grunow, Wappingers Falls, NY (US); Henry A. Nye, III, Brookfield, CT (US); David L. Rath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 11/307,642

(22) Filed: Feb. 15, 2006

(65) Prior Publication Data

US 2008/0012142 A1    Jan. 17, 2008

(51) Int. Cl.
*H01L 21/82* (2006.01)
*H01L 21/4763* (2006.01)

(52) U.S. Cl. ............... 438/128; 438/639; 257/E21.575
(58) Field of Classification Search ............... 438/128, 438/639
See application file for complete search history.

(56) References Cited

U.S. PATENT DOCUMENTS

| | | | |
|---|---|---|---|
| 5,221,449 A | 6/1993 | Colgan et al. |
| 5,281,485 A | 1/1994 | Colgan et al. |
| 5,619,071 A | 4/1997 | Myers et al. |
| 5,930,669 A | 7/1999 | Uzoh |
| 5,933,753 A | 8/1999 | Simon et al. |
| 5,985,762 A | 11/1999 | Geffken et al. |
| 6,291,885 B1 | 9/2001 | Cabral, Jr. et al. |
| 6,429,519 B1 | 8/2002 | Uzoh |
| 6,437,440 B1 | 8/2002 | Cabral, Jr. et al. |
| 6,498,091 B1 | 12/2002 | Chen et al. |
| 6,548,905 B2 | 4/2003 | Park et al. |
| 6,709,987 B2 | 3/2004 | Hashim et al. |
| 6,768,203 B1 | 7/2004 | Simon et al. |
| 6,784,105 B1 | 8/2004 | Yang et al. |
| 2003/0100181 A1 | 5/2003 | Park et al. |
| 2004/0058526 A1 | 3/2004 | Cowley et al. |
| 2005/0056616 A1 | 3/2005 | Cooper et al. |

OTHER PUBLICATIONS

Edelstein, D. et al., "Comprehensive Reliabilitiy Evaluation of a 90 nm CMOS Technology with Cu/PECVD Low-K BEOL." IBM semiconductor Research and Development Center.
Alers, G.B. et al., "Barrier-First Integration for Improved Reliabilitiy in Copper Dual Damascene Interconnects." Novellus Systems, San Jose, CA.
Edelstein, D. et al., "Reliability, Yield, and Performance of a 90 nm SOI/Cu/SiCOH Technology." IBM semiconductor Research and Development Center.

*Primary Examiner*—Thao X Le
*Assistant Examiner*—Elias Ullah
(74) *Attorney, Agent, or Firm*—Scully, Scott, Murphy & Presser, P.C.; H. Daniel Schnurmann (57) ABSTRACT

Methods are provided that enable the ability to use a less aggressive liner processes, while producing structures known to give a desired high stress migration and electro-migration reliability. The present invention circumvents the issue of sputter damage of low k (on the order of 3.2 or less) dielectric by creating the via "anchors" (interlocked and interpenetrated vias) through chemical means. This allows the elimination or significant reduction of the sputter-etching process used to create the via penetration ("drilling, gouging") into the line below in the barrier/seed metallization step. The present invention achieves the above, while maintaining a reliable copper fill and device structure.

7 Claims, 9 Drawing Sheets

STRUCTURE AND METHOD OF CHEMICALLY FORMED ANCHORED METALLIC VIAS

FIELD OF THE INVENTION

The present invention relates to semiconductor integrated circuits, and more particularly to semiconductor interconnect structures including chemically formed anchored metallic vias. The present invention also provides methods of forming the inventive semiconductor interconnect structure.

BACKGROUND OF THE INVENTION

Generally, semiconductor devices include a plurality of circuits that form an integrated circuit including chips, thin film packages and printed circuit boards. Integrated circuits (ICs) can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity and number of integrated circuits are increased. Thus, the formation of multilevel or multilayered interconnect schemes such as, for example, dual damascene wiring structures, have become more desirable due to their efficacy in providing high speed signal routing patterns between large numbers of transistors on a complex semiconductor chip. Within the interconnect structure, metal vias run perpendicular to the silicon substrate and metal lines run parallel to the silicon substrate.

Presently, interconnect structures formed on an integrated circuit chip consists of at least about 2 to 8 or more wiring levels fabricated at a minimum lithographic feature size designated about 1× (referred to as "thinwires") and above these levels are about 2 to 4 or more wiring levels fabricated at a thickness and pitch equal to about 2× and/or about 4× the minimum thickness and pitch of the thinwires (referred to as "fatwires"). In one class of structures, the thinwires are formed in a low dielectric constant (k) organosilicate glass (OSG) dielectric layer that includes atoms of Si, C, H and O, and the fatwires are made in a silicon dioxide dielectric layer having a dielectric constant of about 4. In anther class of structures, thinwires are formed in one type of low dielectric constant (k) organosilicate glass (OSG, SiCOH), some fatwires are made in the same or a different variant of SiCOH, and some fatwires may be made of silicon dioxide or silicon dioxide doped with fluorine. Additionally, other values of multipliers such as 1.4×, 6×, 8×, etc. have been used for wiring levels rather than just the traditional 2× and 4× fatwires.

With microelectronics industry's gradual transition to porous dielectrics (k of less than 2.5) for interconnect integration, new integration challenges have emerged. One key issue is related to the poor mechanical properties of the low k dielectrics. The very low modulus, E, typically less than 5 GPa, contributes to the undesirable deformation of the previously constructed profile shapes in the ILD material during the physically aggressive liner sputtering process that is commonly practiced in semiconductor processing. A typical defect induced by aggressive liner sputtering is the unacceptable roughening of the trench bottoms. This raises concerns about the integrity of the liner coverage at these roughened interfaces, related plating defectivity and, most importantly, the stress migration/electromigration reliability.

U.S. Pat. No. 5,619,071 to Myers et al. disclose a high performance and reliable interconnect structure for preventing via delamination. Specifically, Myers et al. provide a multilayer interconnect structure comprising a titanium aluminide electromigration shunt layer, an aluminum alloy bulk conductor and a titanium aluminide capping layer formed on an insulating layer of a semiconductor substrate. A second insulating layer is formed on and around the multilayer interconnection. A via connection comprising tungsten has a first portion with a first width which extends through the insulating layer and through the capping layer of the interconnection line, and a second portion wider than the first portion, which is formed on the bulk conductor and underneath the capping layer to thereby lock the via connection into the interconnection.

U.S. Pat. No. 6,548,905 to Park et al. (corresponding to U.S. Publication No. 2002/0109234 A1) provides a semiconductor device in which electromigration is prevented, reliability concerns are reduced and resistance of the via contact interface at a multilayer Cu line is lowered. In accordance with Park et al., the semiconductor device having these properties comprises a lower copper line formed on a substrate; an interlayer insulating layer formed on the lower copper line; an upper copper line formed on the interlayer insulating layer; a copper via contact formed within the interlayer insulating layer for electrically connecting the lower copper line and the upper copper line; a concave recess formed within the lower copper line, the concave recess being vertically aligned and arranged below the copper via contact; and a patterned barrier layer formed at a bottom portion of the concave recess, wherein the lower copper line and the copper via contact are directly electrically connected at an interface along sides of the concave recess.

It is noted that in Park et al. it is desired that the etch into the Cu line be half the depth of the line and 1.25× the width of the definition via. This significant depth leads to significant undercut and can also lead to excessive over-etch (based on statistical process variations in high-volume manufacturing) that could cause undesired voiding of the subsequent Cu metal fill. Furthermore, Park et al. design their structure such that liner coverage is substantially absent on the sidewalls of the recess into the Cu line in order that the Cu via to Cu line contact will occur with their stated objective of the elimination of the additional electrical resistivity that a liner barrier material introduces into the via/line contact. Moreover, the etchant behavior suggested in Park et al. will produce a structure with a significant undercut behavior that would be detrimental to a reliable contact design.

Figure 1A:
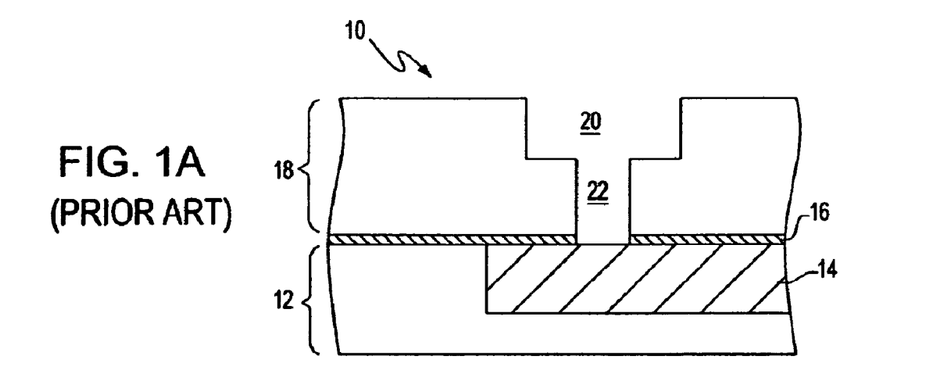
FIGS. 1A-1E are pictorial representations (through cross sectional views) depicting the prior art process disclosed in Park et al.

FIGS. 1A-1E are pictorial representations depicting the prior art process disclosed in Park et al. FIG. 1A shows a structure 10 formed just prior to the construction of the copper recess. Specifically, prior art structure 10 includes a lower interlevel dielectric (ILD) 12 which includes a Cu wiring region 14 embedded therein. For clarity, the liner coverage of the Cu wiring region 14 is not illustrated, but it is normally present. The structure 10 also includes a first dielectric cap 16 that is located over the lower ILD 12 and the Cu wiring region 14; the first dielectric cap 16 is opened at this point of the prior art process exposing a surface of the Cu wiring region 14. Atop the first dielectric cap 16 is an upper ILD 18 that has a line opening 20 and a via opening 22 located therein. The materials and processing steps used in forming the prior art structure 10 are conventional and are well known in the art.

Figure 1B:
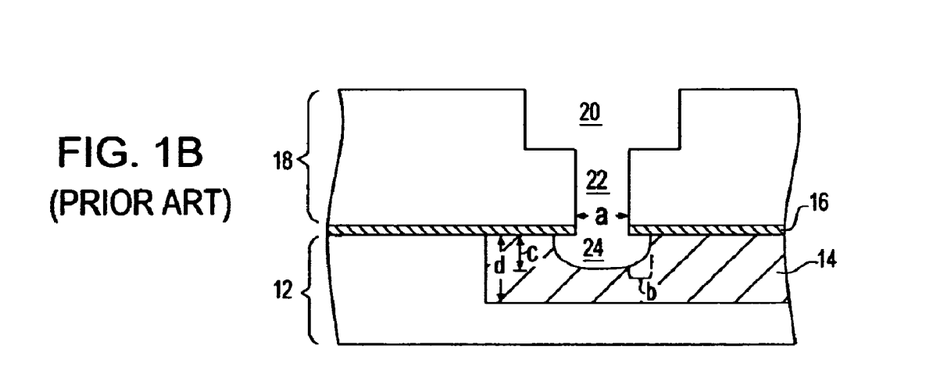

Prior art FIG. 1B illustrates the structure 10 after the Cu wiring region 14 has been recessed by a conventional etching process. Reference numeral 24 denotes the recessed opening provided in the Cu wiring region 14. In FIG. 1B, letter "a"

refers to a critical diameter of the via opening 22, letter "b" refers to the undercut beneath the dielectric cap 16 during the Cu etch, letter "c" refers to the depth of the etch into the Cu wiring region 14, and letter "d" denotes the full thickness of the Cu wiring region 14. In Park et al., it is disclosed that 1.25a=c, c=b, and c=d/2. That is, Park et al. disclose that the recess etched into the metal line should be half the depth of the line and 1.25× the width of the via.

Figure 1C:
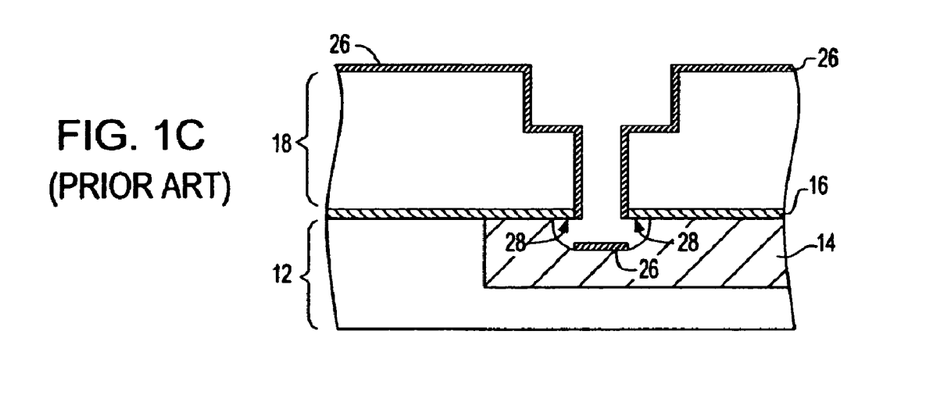

Prior art FIG. 1C illustrates the structure of FIG. 1B after liner and seed liners have been deposited. It is noted that the liner 26 is discontinuous because of the difficulty in bridging the large undercut that is provided by the Park et al. process; the sides of the undercut denoted by reference numeral 28 are not covered by liner 26 (see FIG. 1C). Note that in FIG. 1C the liner (26) deposition is line of sight and does not extend beyond the direct aperture of the via opening. In Park et al., the very large etch recess results in this discontinuous liner 26 and enables increased surface area for Cu-to-Cu connection. An unfortunate result of this very large etch recess is that the electrical connection necessary for efficient electrolytically plated copper fill of this very large etch recess is very difficult to achieve. The typical liner and seed for the subsequent metallization structure become discontinuous at the upper part of the etched recess and thus the electrical connection for the electrochemical fill of this recess must find alternative pathways for electrical circuit closure. Park et al. argue that a sputtering process will not provide sufficient electrical connection for proper electroplating of their concave recess and suggest the use of a CVD copper seed layer to provide electrical connection to the discontinuous copper line in order to enable the electrochemical plating of their concave recess. However, it has been found that a CVD Cu seed layer has poor adhesion to many materials, both dielectric and conductive and this consequently leads to poor electromigration reliability of the Cu interconnect.

Figure 1D:
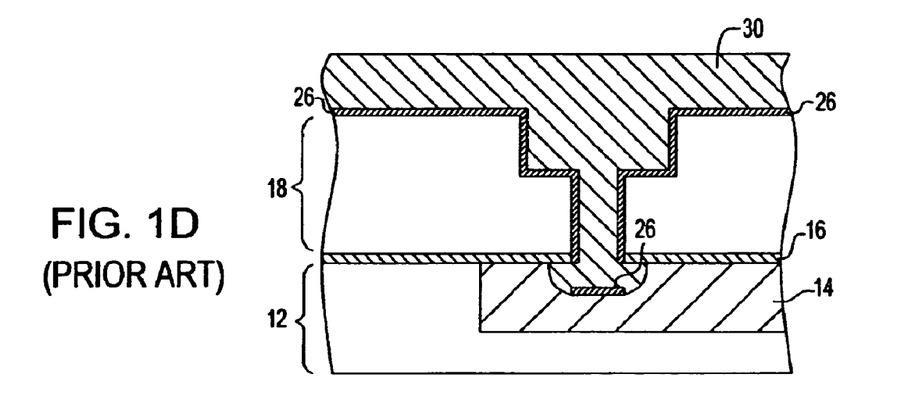
Figure 1E:
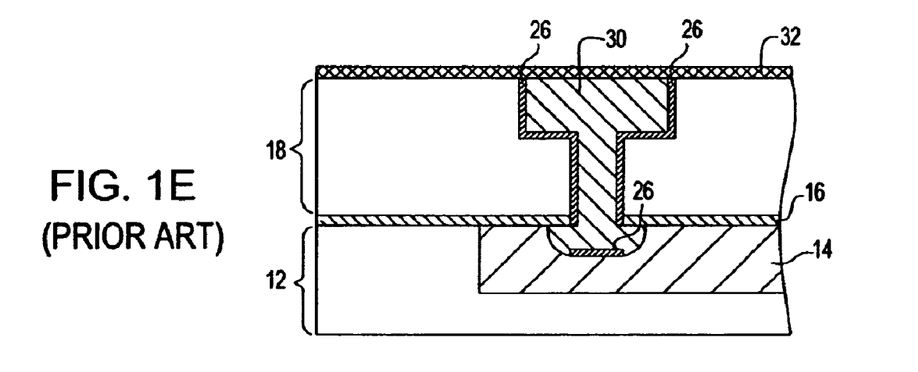

Prior art FIG. 1D shows the ideal structure after Cu 30 deposition which fills the recessed opening 24, the via opening 22, and the line opening 20. Prior art FIG. 1E illustrates the structure after planarization and deposition of a second dielectric cap 32. As shown, the second dielectric cap 32 covers the Cu filled line and the upper ILD 18.

In view of the above, there is a need for providing a structure and methods of chemically formed anchored metallic vias in which the depth of the anchoring is substantially less than ½ the anchored—to interconnect thickness—that in turn requires a Cu etch that is highly controllable on the nanometer scale. There is also a need for providing an etched recess with an improved electrical pathway through the use of a sufficiently continuous liner or non-CVD Cu seed layer for subsequent electrochemical deposition of the metal fill; whereby, the sufficiently continuous liner or seed layer enables the fill of the recess etched into the lower copper line resulting in a device that meets a high level of functional reliability. The applicants of the present application have determined that the electrical pathway may be maintained by a sufficiently continuous liner if the etch recess is designed to a different dimensional ratio such that the resultant IR drop (where I=current, R=resistance) from the deposited liner or seed layer is sufficiently small to maintain a proper current level for copper fill, and that this can produce a reliable device structure.

SUMMARY OF THE INVENTION

The present invention provides methods that enable the ability to use a less aggressive PVD liner deposition processes, while producing structures known to give a desired high stress migration and electro-migration reliability. The present invention circumvents the issue of sputter damage of low k (on the order of 3.2 or less) dielectrics by creating the via "anchors" (interlocked and interpenetrated vias) through chemical means. This allows the elimination or significant reduction of the sputter-etching process used to create via penetration ("drilling, "gouging") into the line below in the barrier/seed metallization step. The present invention achieves the above, through the use of a highly controllable nanometer-scale etch method, and a specific maximum dimensional recess etch ratio. Some embodiments also provide for a sufficiently continuous liner or non-CVD Cu seed layer to produce a structure with the desired reliability characteristics of high stress migration and electromigration reliability.

In accordance with one embodiment of the present invention, the metallic via anchor is first defined by using a selective etching process (wet or dry) to create a blind etched recess with nanometer precision in the underlying metal, particularly, Cu, line. The blind etched recess, which is also referred to herein as an anchoring recessed area, is vertically aligned and arranged below the via opening. Subsequent processing proceeds with standard conductive metallization. Due to the construction size of the blind etch recess and the nature of the deposition processing employed, the etched recess is filled with a conductive metal in a void-free manner, despite the possibility of portions of the recess having been re-entrant (i.e. "undercut").

In one embodiment of the present invention, the selective etching process includes an isotropic metal wet etch with nanometer (nm) control, which is used to etch an anchoring recess (on the order of about 100 to about 700 Å) in the lower metal line, particularly Cu line, within the via opening. In another embodiment of the present invention, the selective etching process includes a dry chemical etch as a reverse metal-chemical vapor deposition (CVD) reaction. In addition to these respective etch processes, multiple methods are used in the present invention to produce liner and/or seed structures that will enable the plating of a reliable via interconnect.

In each of the embodiments described above, the specified etch gap dimensional ratio, being substantially less than 50% of the lower interconnect thickness, can lead to a sufficiently continuous liner and/or seed to be formed beneath the cap of the undercut region within the structure, e.g., within the anchored recess opening. This, in turn, can provide a finite resistance pathway from the top of the wafer into the recess, and, in turn, can lead to void-free Cu electroplated fill.

Some liner/seed discontinuity may exist in the undercut region beneath the dielectric cap, but this discontinuity does not introduce an excessive IR drop (I=current, R=resistance). A significant IR drop (IR>10 mV) might result in difficulties during metal fill such as plating voids. In this embodiment, the use of a sufficiently continuous liner or seed avoids any IR drop that would produce a resultant structure that could contain reliability defects such as plating voids. By "sufficiently continuous" it is meant that the liner/seed coverage within the via and anchor recessed area is capable of providing a continuous electrical pathway to the initially discontinuous copper interconnect surface which surrounds the etched anchor recess. The applicants of the present application have determined that as long as the resistance (R) is less than, or equal to, approximately 1 GΩ (i.e., giga ohms) one can produce a reliable copper structure, however, the more preferred resistance target is less than approximately 100 MΩ (i.e., mega ohms). Some liner/seed discontinuity may exist in the undercut region beneath the dielectric cap, so long as this discontinuity does not introduce an excessive IR drop or result in plating voids. In some embodiments, the liner deposition is designed to be completely continuous resulting in liner coverage even on the underside of the undercut surfaces of the anchoring recessed area.

Unlike Park et al. in which a large undercut area is provided, the applicants of the present invention have determined that the undercut formed beneath the dielectric cap adjacent the via opening is detrimental to forming a reliable contact design and that the desired structural ratio should be an etch of ⅓ or less the depth of the line. This dimensional consideration can result in a reliable integration structure through the use of a liner and seed process that results in an IR drop that is compatible with a void-free and reliable copper fill.

In general terms, a first method of the present invention comprises:

providing a structure comprising a lower interlevel dielectric having at least one metal line embedded therein, a first dielectric cap having an opening exposing a surface of the at least one metal line located on said lower interlevel dielectric, and an upper interlevel dielectric having a least one via opening therein located on the first dielectric cap;

selectively etching said at least one metal line at said opening exposing a surface to provide an anchoring recessed area and an etched metal line, said anchoring recessed area having a depth of one third or less the depth of the at least one metal line; and filling said at least one line opening, said at least one via opening and said anchoring recessed area with a conductive material.

The upper interlevel dielectric of the initial structure may also include at least one line opening located above the at least one via opening.

A second method of the present invention comprises:

providing a structure comprising a lower interlevel dielectric having at least one metal line embedded therein, a first dielectric cap having an opening exposing a surface of the at least one metal line located on said lower interlevel dielectric, and an upper interlevel dielectric having a least one via opening located on the first dielectric cap;

selectively etching said at least one metal line at said exposed surface to provide an anchoring recessed area and an etched metal line, said anchoring recessed area having a depth of one third or less of the depth of the at least one metal line;

providing a sufficiently continuous liner and/or seed layer covering at least said etched metal line within said anchoring recessed area; and filling said at least one via opening and said anchoring recessed area with a conductive material.

The upper interlevel dielectric of the initial structure may also include at least one line opening located above the at least one via opening.

A third method of the present invention comprises:

providing a structure comprising a lower interlevel dielectric having at least one metal line embedded therein, a first dielectric cap having an opening exposing a surface of the at least one metal line located on said lower interlevel dielectric, and an upper interlevel dielectric having a least one via opening located on the first dielectric cap;

selectively etching said at least one metal line at said exposed surface to provide an anchoring recessed area and an etched metal line, said anchoring recessed area having a depth of one third or less of the depth of the at least one metal line;

providing a substantially continuous liner and/or seed layer covering at least said etched metal line within said anchoring recessed area; and filling said at least one via opening and said anchoring recessed area with a conductive material.

The upper interlevel dielectric of the initial structure may also include at least one line opening located above the at least one via opening.

In a fourth method of the present invention, a via-exposed metal is first treated to promote oxidation down to a predetermined depth of from about 100 to about 300 Å. Then, a wet etchant is used such as, for example, an oxygen-free dilute acid, to remove the metal oxide selective to unoxidized metal to reveal the recess. The remaining method is the same as in the first or second embodiments.

In a fifth method of the present invention, a via-exposed metal is first treated to promote oxidation down to a predetermined depth of from about 100 to about 300 Å. Then, a wet etchant is used such as, for example, an oxygen-free dilute acid, to remove the metal oxide selective to unoxidized metal to reveal the recess. In this variation of the fourth method, there is a slight protrusion of the dielectric cap into the metallic fill area This slight protrusion can assist the mechanical anchoring of the via in the integration structure as it contributes a mechanical locking feature over a structure with totally continuous co-planer sidewalls. The remaining method is the same as in the first or second embodiments.

In general terms, the fourth and fifth methods of the present invention comprise:

providing a structure comprising a lower interlevel dielectric having at least one metal line embedded therein, a first dielectric cap having an opening exposing a surface of the at least one metal line located on said lower interlevel dielectric, and an upper interlevel dielectric on said first dielectric cap, said upper interlevel dielectric having a least opened area vertically aligned with said opening of said first dielectric cap;

oxidizing said exposed surface of said at least one metal line, and exposed sidewalls of said first dielectric cap and said upper interlevel dielectric;

providing a planarizing dielectric material to said structure, said planarizing dielectric material filling said opened area;

providing a line opening in an upper portion of the upper interlevel dielectric by selectively removing portions of the planarizing dielectric material, oxidized surface of the interlevel dielectric and the upper interlevel dielectric;

removing remaining planarizing dielectric material within said opened area;

removing any remaining oxidized surface of the interlevel dielectric and said first dielectric cap as well as the oxidized surface of the metal line whereby a via opening and an anchoring recessed area are formed;

providing a liner and seed layer which is continuous in the via and may be substantially continuous within said anchoring recessed area; and filling said at least one line opening, said at least one via opening and said anchoring recessed area with a conductive material.

In addition to the general methods described above, the present invention also provides semiconductor structures that are fabricated using the same. In general terms, the semiconductor structure of the present invention comprises:

a lower interlevel dielectric having at least one etched metal line therein;

a first dielectric cap having an opening located on said lower interlevel dielectric;

an upper interlevel dielectric located on said first dielectric cap, said upper interlevel dielectric having a least one metallic via and optionally at least one overlaying metallic line therein, said at least one etched metal line and said at least one metallic via are in a contact with each other by a metallic anchoring via; and a liner and seed layer within the at least one etched metal line within an anchoring recessed area defined by said at least one metallic via.

DETAILED DESCRIPTION OF THE INVENTION

The present invention, which provides a semiconductor structure having chemically formed anchored metallic vias and methods of fabricating the same, will now be described in greater detail by referring to the drawings that accompany the present application. It is noted that the drawings are provided for illustrative purposes and, as such, they are not drawn to scale. Also, in the embodiments depicted below, like components or elements are referred to by like reference numerals.

The first embodiment of the present invention will now be described in greater detail. As stated above, an isotropic metal wet etch with nm control or a dry chemical etching process is used to etch a deep anchoring recessed area within an exposed metal line. Specifically, and in the first embodiment of the present invention, a via first dual damascene interconnect structure is formed and prior to liner deposition, the metal line within the lower interlevel dielectric is etched to form an anchoring recessed area. Although a dual damascene structure is shown and described, the inventive method also works with a single damascene structure.

In accordance with one embodiment of the present invention, the anchoring recessed area is formed utilizing a chemical etchant that enables fine control upon the dimensions of the etched anchoring recess area within the metal line. Alternatively, a chemical dry etching process can be used to provide the anchoring recessed area. In accordance with the present invention, both the depth of the etching step and the concomitant undercut region below the dielectric cap are limited. Excessive undercutting is detrimental to a reliable contact design and the desired structural ratio should be an etch into the metal line which is one third or less the depth of the metal line.

Figure 2A:
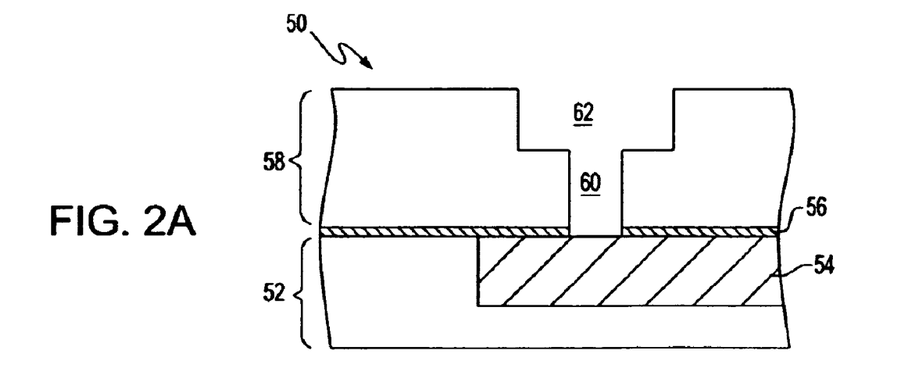
FIGS. 2A-2E are pictorial representations (through cross sectional views) depicting a first embodiment of the present invention.

The first embodiment of the present invention is now described in greater detail by referring to FIGS. 2A-2E. FIG. 2A shows an initial structure 50 prior to construction of the anchoring recessed area that includes a lower interlevel dielectric (ILD) 52 having at least one metal line 54 embedded therein. The metal line 54 is typically separated from the ILD 52 by a diffusion barrier (not shown). The initial structure also includes a first dielectric cap 56 having an opening that exposes a surface of the at least one metal line 54 atop the lower ILD 52. An upper ILD 58 having at least one via opening 60 and, optionally, at least one line opening 62 is located on the first dielectric cap 56. As illustrated, the at least one via opening 60 is located beneath the at least one line opening 62 and the at least one via opening 60 is substantially aligned with the opening provided in the first dielectric cap 56.

The processing of the initial structure 50 shown in FIG. 2A includes any conventional dual damascene or interconnect process in which a via opening is first provided to the upper ILD and thereafter a line opening is also provided to the upper ILD. Such processing, which typically includes lithography and etching, is well known to those skilled in the art and, as such, no further details concerning the formation of the initial structure 50 is made herein. It is again noted that the present invention and disclosed methods also work well when a single damascene structure is used.

The materials of the initial structure 50 are also conventional and are well known to those skilled in the art. For example, the lower ILD 52 of the initial structure 50 comprises any dielectric material having a dielectric constant of about 3.2 or less, with a dielectric constant of about 2.5 or less being even more typical. The lower ILD 52 may be porous or non-porous, with porous dielectrics being more preferred since they have a lower dielectric constant than the chemically equivalent non-porous dielectric. Examples of dielectrics that can be used for the lower ILD 52 include, but are not limited to:

organosilicate glass materials such as carbon doped oxides which typically include atoms of Si, C, H and O, with N and/or F being optional, aromatic thermosetting polymeric resins, silsesquioxanes, organosilicates, alkoxysilanes, polyarylene ethers, polybenzoxazoles and combinations or multilayers thereof. Typically, the lower ILD 52 is comprised of a porous carbon doped oxide including atoms of Si, C, H and O.

The thickness of the lower ILD 52, which is typically formed by a conventional deposition process, may vary depending upon the type of ILD material used as well as the deposition process that was used in forming the same. Typically, the lower ILD 52 has a thickness from about 70 to about 1000 nm, with a thickness from about 200 to about 500 nm being even more typical. The ILD dielectric materials mentioned above may be deposited by multiple means. CVD and spin-on applications of these dielectric materials are the most common, but this invention is not limited by the means of the dielectric material application technique.

The metal line 54 which is embedded within the lower ILD 52 comprises a conductive metal, metal alloy, metal silicide or combination thereof. Preferably, the metal line 54 comprises a conductive metal such as, for example, W, Cu, or Al, with Cu being highly preferred in the present invention. Sputtering, plating or another like deposition process can be used to fill a line opening previously formed by lithography and etching in the lower ILD 52 with the conductive material. The diffusion barrier that is typically present between the metal line 54 and the lower ILD 52 comprises any material that prevents diffusion of conductive material from the metal line 54 into the lower ILD 52. Illustrative examples of diffusion barriers that can be useful for this purpose include, but are not limited to: Ti, TiN, Ta, TaN, WN and other like materials that inhibit diffusion of conductive material. Combinations and multilayers thereof are also contemplated in the present invention. PVD, CVD, ALD, or combinations of these techniques or other conventional deposition techniques can be used in forming the diffusion barrier.

The first dielectric cap 56 including the opening that exposes a surface of the metal line 54 comprises an organic or inorganic dielectric material. Examples of dielectrics that can be used as the first dielectric cap 56 include, but are not limited to: $SiO_2$, silicon nitride, silicon oxynitride, and/or a dielectric comprising atoms of Si and C, with N, O and H being optional. Typically, and in a preferred embodiment of the present invention, a dielectric comprising atoms of Si, C, N, O and H is employed as the first dielectric cap 56. The non-opened first dielectric cap 56 is formed utilizing a conventional deposition process including, for example, chemical vapor deposition (CVD), plasma enhanced chemical vapor deposition (PECVD), spin-on coating, evaporation, chemical solution deposition and other like deposition processes. The thickness of the first dielectric cap 56 may vary depending on the type of materials employed, the number of materials used in forming the same, and the deposition process used. Typically, the first dielectric cap 56 has a thickness, after deposition, from about 20 to about 100 nm, with a thickness from about 35 to about 50 nm being even more typical.

In some embodiments, an optional organic adhesion promoter (not shown) is formed between the first dielectric cap 56 and the lower ILD 52 and/or between the first dielectric cap 56 and the upper ILD 58 to be subsequently formed. Although optional, it is often preferred to employ the organic adhesion promoter since such a layer provides a strong bond between the dielectric cap and the ILDs. When present, the optional organic adhesion promoter is formed utilizing a conventional deposition process such as, for example, spin-on coating, evaporation, CVD, PECVD, chemical solution deposition, dip coating, brush coating, immersion and other like deposition processes. The optional organic adhesion promoter is typically an aliphatic or aromatic organic compound including atoms of C, H, Si, O and optionally F. Illustrative examples of suitable organic adhesion promoters that can be employed in the present invention include, but are not limited to:

alkoxysilanes, polyarylene ethers, polybenzoxazoles, etc.
The thickness of the optional organic adhesion promoter is typically from about 10 to about 100 nm, with a thickness from about 20 to about 50 nm being even more typical.

The upper ILD 58 may comprise the same or different, preferably the same, dielectric material as the lower ILD 52. As was the case with the lower ILD 52, the upper ILD 58 is typically a porous dielectric material. The upper ILD 58 is also formed by a conventional deposition process, and it typically has a thickness from about 70 to about 1000 nm, with a thickness from about 200 to about 500 nm being even more typical.

A conventional via first and then line patterning and etching process is employed that provides the line opening 62 and the via opening 60 in the upper ILD 58. For the processing the applicants of the present application have designed for the first embodiment, it is not necessary to open the dielectric cap (56) during the via etch process;

this cap opening can occur during the ending sequences of the
RIE processes used during the line formation sequence. It is noted that during the fourth and fifth embodiments, that following the etching of the via opening 60, the first dielectric cap 56 is opened to expose the metal line below. The cap opening at the end of the via open step is required as during the fourth and fifth embodiments embodiment this opening in the cap is used to enable the oxidation of the metal (preferred copper type metallurgy) exposed in the bottom of this opening for subsequent removal of the oxidized metal (preferred copper type metallurgy) during the inventive process to produce an anchoring recess.

Figure 2B:
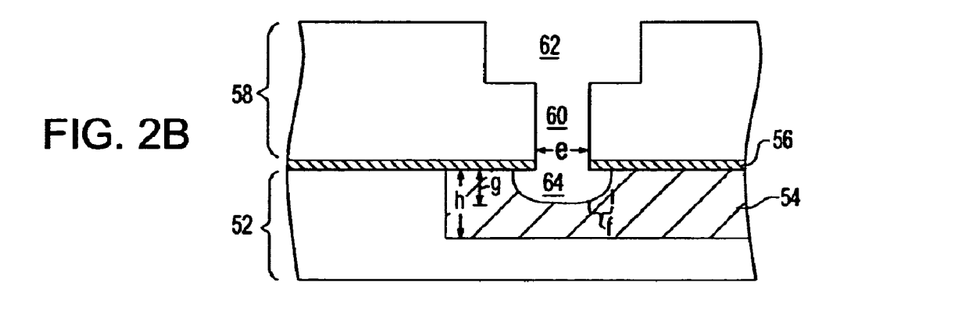

FIG. 2B shows the structure of FIG. 2A after performing the inventive metal line-etching step. Specifically, the structure shown in FIG. 2A is subjected to an etching step that has the ability to etch the exposed metal line 54 with nm precision. This etching step provides a recessed opening within the exposed metal line as is shown in FIG. 2B. The recessed opening is referred to herein as an anchoring recessed area and it is labeled by reference numeral 64. As shown, the via opening 60 has a width denoted as "e" in FIG. 2B, the depth of the unetched metal line 54 is denoted as "h" in FIG. 2B and the depth of the anchoring recessed area is denoted as "g" in FIG. 2B. FIG. 2B also includes letter "f" which represents an undercut region (or area) that is formed beneath the first dielectric cap 56 adjacent to the via opening 60.

In accordance with the present invention, a selective etch is used in forming the anchoring recessed area 64 in which f is less than, or equal to g. In other terms, both the depth of the etching step and the concomitant undercut region below the dielectric cap are limited. Excessive undercutting is detrimental to a reliable contact design and the desired structural ratio should be an etch into the metal line 54 which is one third or less the depth of the metal line 54.

In one embodiment of the present invention, an isotropic etching process is used in creating the anchoring recessed area 64 having the dimensions mentioned above. Typically, the isotropic etching process includes a wet chemical etchant that comprises an aqueous etching composition that includes at least an oxidant. The wet chemical etchant may also include a mixture of at least one strong complexant agent and a weak complexant agent for a conductive material, i.e., conductive metal, metal alloy, etc., and water. One such etchant is disclosed, for example, in U.S. Patent Application Publication No. 2005/0056616 A1 to Cooper et al., the entire content of which is incorporated herein by reference. The pH of the aqueous etching composition is typically from about 6 to about 12 so as to form an oxidized etch controlling layer of a metal compound and to remove the conductive material. That is, the use of the aforementioned etchant makes possible the uniform removal or the conductive material. Although the etchant can be used to remove most conductive materials mentioned herein, it is highly preferred to use the etchant to remove Cu or a Cu alloy.

Suitable oxidants include, for example, peroxide such as hydrogen peroxide, peroxy carboxylate, perborate, percarbonate or a mixtures thereof. A preferred oxidant that can be employed in the present invention is hydrogen peroxide. The amount of oxidant is typically about 0.05 wt % to about 10 wt %, and more typically about 2 wt % to about 4 wt %.

The weak complexant typically has a cumulative stability constant with the conductive material that is typically less than, or equal to, $1 \times 10^{14}$. Examples of weak complexants that can be used in the present invention, include but are not limited to: ammonia; amines such as ethylamine, methylamine, tetramethylammonium hydroxide and 2-hydroxyethyl-trimethylammonium hydroxide. The preferred weak complexant is ammonia, typically added as a concentrated ammonium hydroxide solution. The molar concentration of the weak complexant is typically about 0.1 molar to about 0.8 molar and preferably about 0.2 molar to about 0.4 molar.

The strong complexant typically has a cumulative stability constant with the conductive material of greater than, or equal to $1 \times 10^{15}$. Examples of strong complexants include, but are not limited to: aminocarboxylates and aminophosphonates, and more specifically, 1,2-cyclohexane diaminetetraacetic acid (CDTA), ethylene diamine tetraacetic acid (EDTA), triethylenetetraaminehexaacetic acid; diethylene triaminepentaacetic acid; 2,2-dimethyl-1,3-diaminopropan-e-N,N,N',N'-tetraacetic acid; cis,cis,cis-3,5-dimethyl-1,2-diaminocyclopen-tane-N,N,N',N'-tetraacetic acid and cis-bicyclo(2.2.2)octane-2,3-diamine-N-,N,N',N'-tetraacetic acid. Preferred strong complexants are CDTA and DTPMP (diethylenetriamine-penta-methylene phosphonic) acids.

DTPMP acids due to their stability against oxidation by peroxide, and EDTA, with CDTA and DTPMP being most preferred. The strong complexant is typically present in amounts of about 0.001 to about 10 g/l.

The use of a combination of both the weak complexant and strong complexant makes possible a relatively steady state regime of continuous inhibiting formation and dissolution. Without wishing to be bound to any theory, it is believed that the presence of the strong complexant ensures a continuous slow dissolution of the inhibiting layer, which in turn makes possible to avoid a multiple etching step process for dissolving the inhibiting layer and then contacting the structure again with the etchant.

The etching process can be carried out in a single etching step. On the other hand, the use of only a strong complexant is not the most preferred approach as the inhibiting layer would not be adequately formed and the etching would tend to be less uniform.

As stated above, the etching composition typically has a pH of about 6 to about 12 and more typically a basic pH. The pH can be adjusted to the desired level by adding a non-oxidizing acid such as sulfuric acid, acetic acid or methanesulfonic acid; or a base such as sodium hydroxide, potassium hydroxide and tetramethyl ammonium hydroxide.

A specific composition that can be employed for Cu or Cu alloys has a volume ratio of 40:2:1 v/v $H_2O:H_2O_2$ 30%: $NH_4OH$ 56.6% (i.e., an aqueous solution containing 1.55 wt % $H_2O_2$ and 0.57 wt % $NH_3$) and 0.05% CDTA, with the pH adjusted downward to 9.5 (by the addition of sulfuric acid), so as to ensure formation of the inhibiting layer. Another such composition has a volume ratio of 40:4:1 v/v $H_2O:H_2O_2$ 30%:$NH_4OH$ 56.6% (i.e., an aqueous solution containing an aqueous solution containing 2.94 wt % $H_2O_2$ and 0.54% $NH_3$) and 0.5% CDTA and a pH of approximately 10.2. In this higher-oxidant case no pH adjustment is necessary for the formation of the inhibiting layer.

The component concentrations and operating temperature are judiciously selected so that contacting of the conductive material with the composition results in a uniform inhibiting or etch control layer. Dissolution of the inhibiting layer in acid generates recesses of uniform depth and smooth, flat conductive material surfaces. Without again being bound to any theory, it is believed that the inhibiting or etch control layer formed in situ is typically a hydrated conductive metal oxide. The inhibiting layer formation then limits the diffusion of the oxidant towards the metal surface, and the diffusion of the metallic ionic species away from the metal surface to govern the overall reaction rate. By creating this inhibiting layer, the surface layer of the conductive material, particularly copper or copper alloy, can be selectively removed thus resulting in a very uniform etching. The complexing components of the solution attack the exposed surface of the inhibiting layer and remove it at a rate which depends on their concentrations. The thickness of the inhibiting layer, and the etch rate, can be controlled by modifying the concentrations of the oxidant and the complexants, as well as the temperature.

It is noted that other etchant solutions, which can provide nm etching control defined above, can also be employed in the present invention. As such, the etchant solutions are not limited to the ones expressly mentioned herein above. For example, etchants that include an oxidant at near neutral pH where the dissolution of the conductive metal oxide formed in situ is almost entirely kinetically controlled can also be used in the present invention in forming the anchoring recessed area 64.

In another embodiment of the present invention, a dry etching process can be used in providing the anchoring recessed area 64 described above. When a dry etching process is employed, the chemistry of the dry etching process must be selective in removing the metal line 54, while providing the criteria mentioned above for the anchoring recessed area 64. Illustrative examples of dry etching chemistries that can be used include, but are not limited to: reactive ion etching utilizing mixtures of: $O_2/CO$, $N_2/O_2$, $H_2O$, Ar, $BCl_3$, $Cl_2$, $NO_2$ and $N_2O$.

After forming the anchoring recessed area 64 within the metal line 54, exposed surfaces of the etched metal line 54 and the upper ILD 58 are then typically, but not necessarily always, cleaned by subjecting the same to an etchant solution that is capable of removing contaminants from exposed surfaces of the etched metal line 54 as well as the upper ILD 58. Examples of typical etchant solutions that can be used to remove contaminants from exposed surfaces of the etched metal line 54 and the upper ILD 58 are dilute HF, etchants supplied by ATMI such as ST-250® or ST-255®, etchants supplied by Air Products Electronic Chemicals such as NE-14®, NE-111® or other similar post reactive-ion etch chemistries.

Figure 2C:
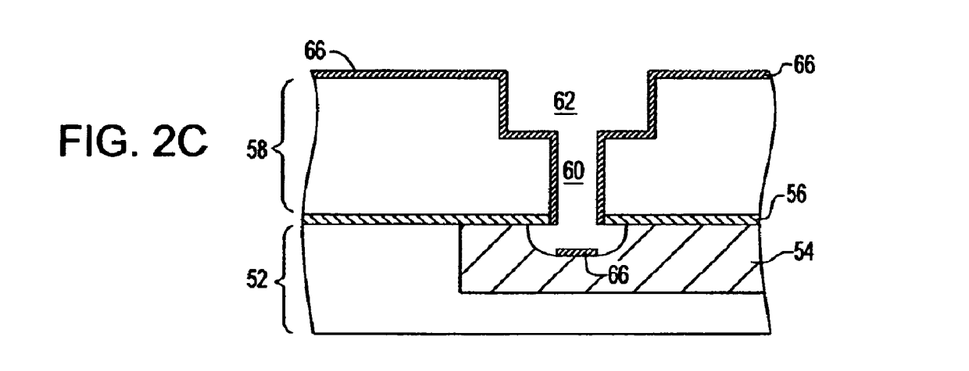

A liner 66 and a metal seed layer (not specifically shown) are then deposited on the exposed surface of the structure shown in FIG. 2B providing the structure shown, for example, in FIG. 2C. The liner 66 and the metal seed layer are formed utilizing any conventional deposition process including, for example, physical vapor deposition (PVD), chemical vapor deposition (CVD), atomic layer deposition (ALD), and other like deposition process that are not detrimental to the ILDs used in the present invention; note aggressive sputtering is not a possible choice since the same can damage the ILD. Combinations of these deposition processes can also be used in forming the liner 66 and the seed layers. The liner 66 is comprised of any material that is capable of preventing the diffusion of conductive material into the upper ILD 58. Some examples of such liners include, but are not limited to: TiN, TaN, Ti, Ta, W, WN, Cr, Nb and other like materials including combinations and multilayers thereof. The liner 66 is a substantially continuous liner both because of less undercut provided by the above mentioned selective etching processes (wet and dry) and the liner deposition technique. The liner may be discontinuous in regions of the anchoring recess area that are not directly accessed by line-of-sight through the via opening.

The metal seed layer comprises any material in which a metallic conductor can be formed thereon. Examples of such material seed layers include, but are not limited to: Cu, Cu—Ti, Cu—Zr, Cu—Al, Ru including combinations and multilayers thereof.

After providing the structure shown in FIG. 2C, a conductive material 68 such as, for example a conductive metal or metal alloy, is deposited within the anchoring recessed area 64, the via opening 60 and the line opening 62 as well as atop the liner 66 that lies on the horizontal surface of the upper ILD 58. Examples of conductive material 68 that can be used in the present invention include, but are not limited to: W, Al, Cu, Ag, Al—Cu and other like conductive materials. Preferably, the conductive material 68 is Cu or a Cu alloy. The conductive material 68 is deposited utilizing a conventional deposition process including, for example, CVD, plasma-enhanced CVD, plating, sputtering, chemical solution deposition and other like deposition processes. The resultant structure, including the conductive material 68 is shown, for example, in FIG. 2D.

Figure 2D:
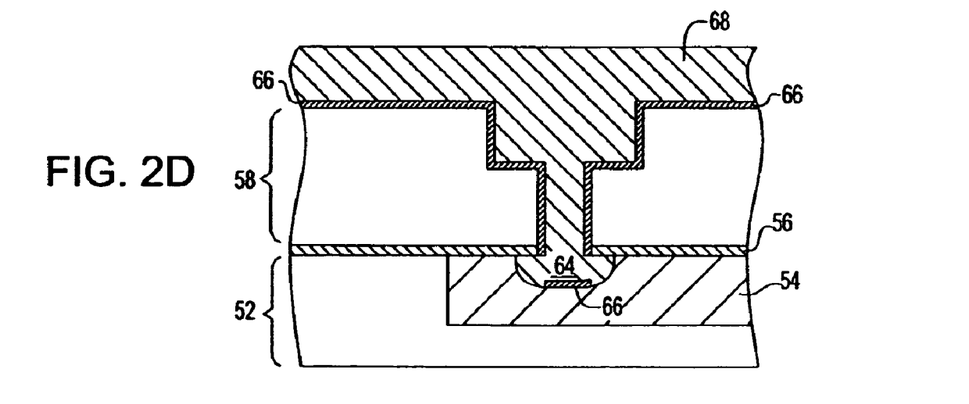
Figure 2E:
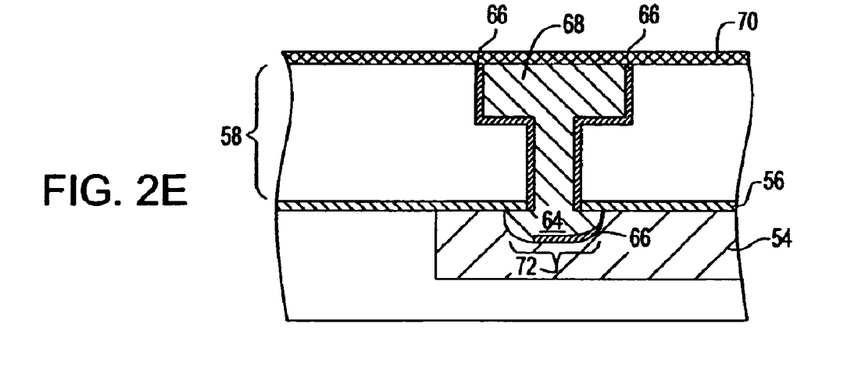

FIG. 2E shows the resultant structure that is formed after subjecting the structure shown in FIG. 2D to a planarization step and after forming a second dielectric cap 70 on the planarized structure, i.e., planarized surfaces of the upper ILD 58 and the conductive material 68. The planarization step includes a conventional planarization process such as, for example, chemical mechanical polishing (CMP) and/or grinding. During the planarization process, the liner 66 atop the upper ILD 58 is removed. The second dielectric cap 70, which may include the same or different dielectric as the first dielectric cap 56, is formed utilizing a conventional deposition process including, for example, CVD, PECVD, evaporation, sputtering, spin-on coating and other like deposition process. The thickness of the second dielectric cap 70 is typically from about 10 to about 100 nm, with a thickness from about 20 to about 50 nm being even more typical.

As is shown in FIG. 2E, the inventive semiconductor structure includes an anchored metallic via 72 in which the exposed surface of the etched (or recessed) metal line 54 is covered with a liner 66. Liner 66 may be substantially continuous within the anchored via 72, although it may be somewhat discontinuous under the first dielectric cap 56. In any case, void-free metal fill can occur under proper plating conditions within the anchoring recess area within the proscribed dimensions of this invention.

The above processing steps can be repeated to form additional interconnect levels atop the structure shown in FIG. 2E. When additional interconnect levels are formed, each will include an anchored metallic via 72 with continuous liner coverage as in accordance with the present invention.

In an analogous manner to the construction illustrated in FIGS. 2A-2E and alternate structure can be produced. In this second embodiment, the structure is built in the same manner as the embodiment described above up until the formation of the structure shown in FIG. 2C, the analog structure shown in FIG. 3A is a line of sight deposition structure.

Figure 3A:
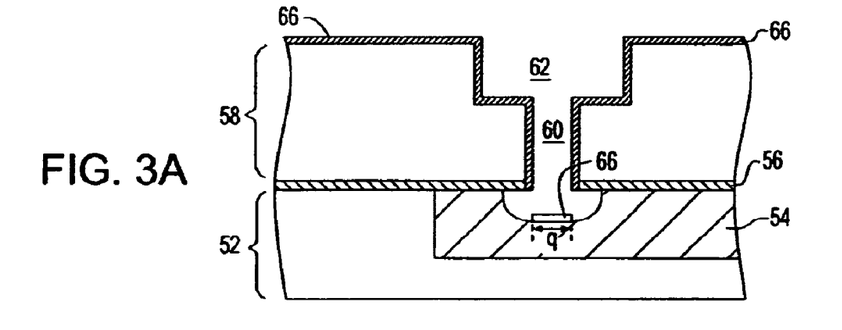
FIGS. 3A-3D are pictorial representations (through cross sectional views) depicting a second embodiment of the present invention.
Figure 3B:
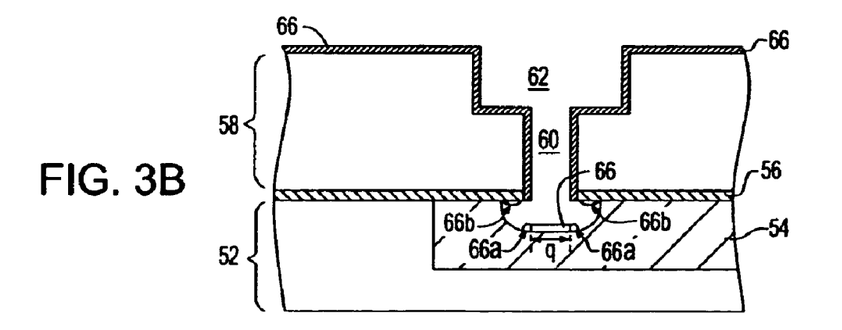
Figure 3C:
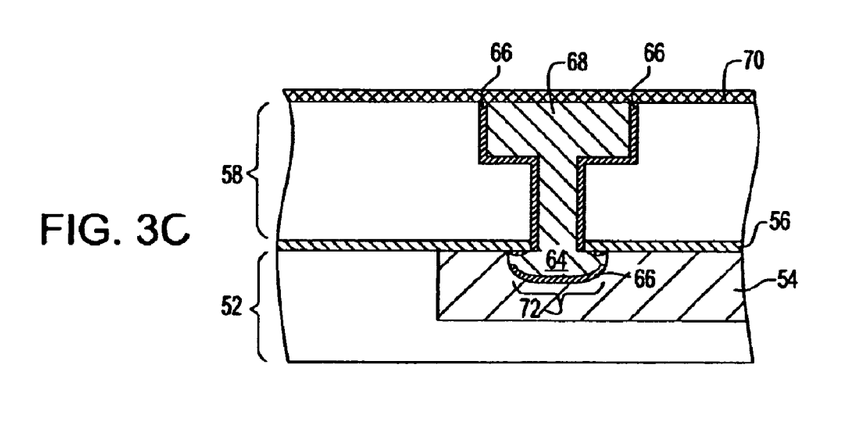
Figure 3D:
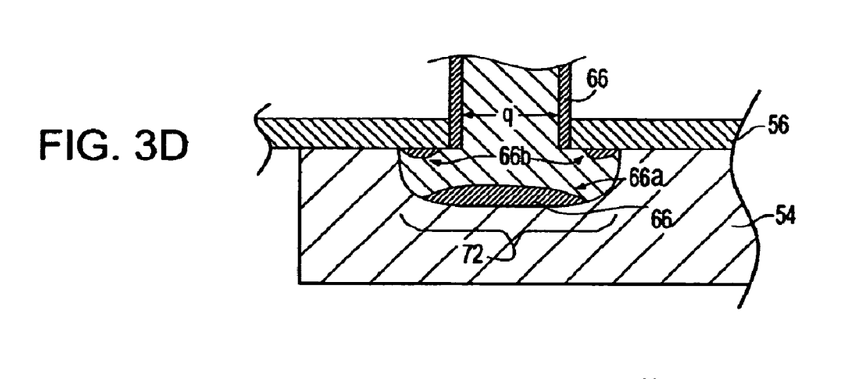

After producing the structure shown in FIG. 3A, a method to redistribute part of the liner and/or seed is employed to spread the liner and/or seed beyond the line of sight aperture, then a conductive material 68 such as, for example, a conductive metal or metal alloy, is deposited within the anchoring recessed area 64, the via opening 60 and the line opening 62 as well as atop the liner 66 that lies on the horizontal surface of the upper ILD 58. Examples of conductive material 68 that can be used in the present invention include, but are not limited to: W, Al, Cu, Ag, Al—Cu and other like conductive materials. Preferably, the conductive material 68 is Cu or a Cu alloy. The conductive material 68 is deposited utilizing a conventional deposition process including, for example, CVD, plasma-enhanced CVD, plating, sputtering, chemical solution deposition and other like deposition processes. A critical difference between this method of construction and the second embodiment is that a method to redistribute part of the liner and/or seed is employed to spread the liner and/or seed beyond the line of sight aperture a process, such as, a slight re-sputtering component is added during the deposition the process to redistribute metal beyond the line of sight as provided by the via aperture. The resultant structure has a re-deposition of the liner as illustrated in FIG. 3B where liner material extends beyond the line of sight path (q) and is present at least as 66a and/or 66b as well as the line of sight 66. The process then follows a similar methodology as the first embodiment to produce the resultant structure as shown in FIG. 3C. FIG. 3D is an expanded drawing of the contact and via recess area and is used to further illustrate the existence of a re-distributed liner and/or seed beyond the line of sight as defined by the aperture q as noted by markers 66b and 66a. Note that this one example of many types of structures that are structures defined by this method—the particular feature is that the liner and/or seed extend at least partly beyond the line of sight of the deposition process.

Figure 4:
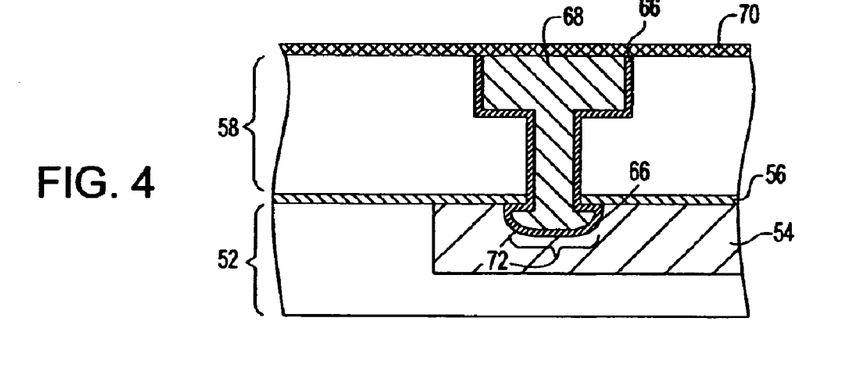
FIG. 4 is pictorial representation (through a cross sectional view) depicting a structure of the third embodiment of the present invention.

FIG. 4 shows another semiconductor Interconnect structure (e.g., third embodiment) that can be formed wherein the liner 66 is continuously present on the exposed surface of the etched metal line 54 within the anchoring recessed area 64, on the underside of the first dielectric cap 56 in the undercut provided during etching of the metal line 54, and on the exposed sidewalls of the upper ILD 58. In this embodiment of the present invention, the continuous liner 66 is formed by ALD or controlled resputtering during PVD deposition. All the other processing steps as described above are the same in forming the alternative structure shown in FIG. 4.

Reference will now be made to FIGS. 5A-5I which illustrate a fourth embodiment of the present invention. In the fourth embodiment of the present invention, a targeted oxidation process which enables a subsequent chemical etch process to selectively remove oxidized ILD and metal materials is employed. The resultant structure provides for a via anchor construction without the detrimental effects that are observed when physical sputtering is used to create an equivalent via anchor structure.

The inventive via anchor construction of this fourth embodiment of the present invention is also accomplished using a via first type damascene integration scheme. The lithographic and RIE transfer images of the via are adjusted to compensate for the removal of an oxidized via sidewall so that the final via structure post the chemical etch will be of the desired target dimensions. At the end of the via first RIE construction, the dielectric cap over the metal line is opened. Then, the metal exposed at the bottom of the via is oxidized with the concomitant oxidation of the dielectric sidewalls of the via. An organic or semi-organic material is used to fill the via and planarize the surface of the structure. Key properties of this organic or semi-organic material is that it does not react with metal or metal oxide and that it be able to be removed at a subsequent step without excessive oxidation of the dielectric or metal surfaces. One method of accomplishing this is to use an organic or semi-organic material that remains soluble in a defined solvent/digestion system during subsequent processing conditions. At the desired point in the integration process where the organic or semi-organic material is to be removed, it is soaked in this defined solvent/digestion system and it is subsequently removed. Another method is to use an organic or semi-organic material that can be thermally decomposed to cleanly remove it at the desired step in the integration sequence. A third method is to use oxidative methods to remove this organic or semi-organic material. However, in the case where oxidative methods are used, the exposed bottom of the dielectric trench cannot be detrimentally oxidized. In this case, a buried hardmask may be employed as an etch stop layer at the bottom of the dielectric trench.

Figure 5A:
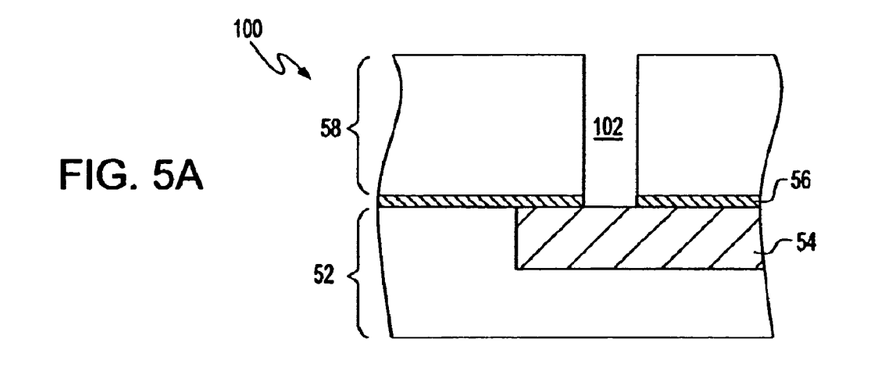
FIGS. 5A-5I are pictorial representations (through cross sectional views) depicting a fourth embodiment of the present invention.

FIGS. 5A-5I provide further details regarding this embodiment of the present invention in which selective oxidation is used. FIG. 5A shows an initial structure 100 that is similar to initial structure 50 shown in FIG. 2A except that the structure 100 does not include a line opening and a via opening at this point of the inventive process. The structure 100 includes a lower ILD 52, a metal line 54 embedded within the lower ILD 52, an opened first dielectric cap 56 that is formed on surfaces of the lower ILD 52 as well as portions of the metal line 54, and an upper ILD 58 having an opened area defined by reference numeral 102. The opened area 102 is designed to have a smaller critical dimension, i.e., width, that the target for the via opening to be subsequently formed. The structure 100 shown in FIG. 5A is fabricated utilizing conventional deposition techniques, lithography and etching.

Figure 5B:
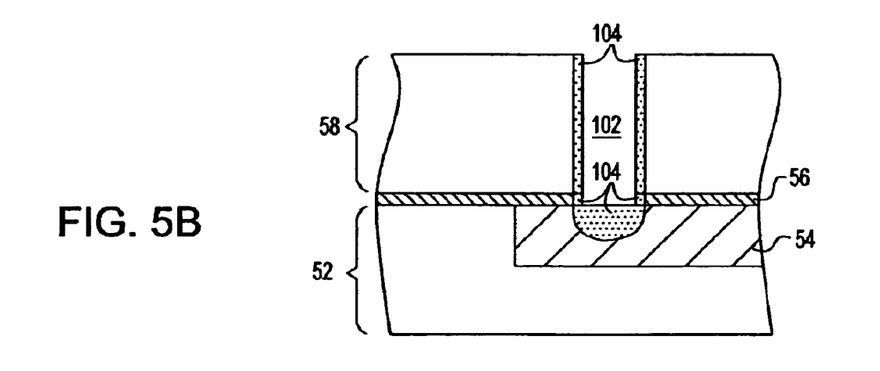

The exposed metal line 54 shown in FIG. 5A is then subjected to an oxidation process. During this oxidation process, the exposed sidewalls of the first dielectric cap 56 and the upper ILD 58 are also oxidized. FIG. 5B shows the resultant structure that is formed after oxidation, and reference numeral 104 is used to denote the oxidized surfaces. Oxidation is achieved in the present invention by exposing the structure 100 to an oxidative plasma process. Although any oxidative plasma process that includes an $O_2$ atmosphere can be used, an oxidative plasma process that includes mixtures or combinations of $O_2$, $O_2/CO$, $O_2/N_2$, $O_3$, $N_2O$, $NO_2$ chemistries is typically used in forming the oxidized areas 104.

Figure 5C:
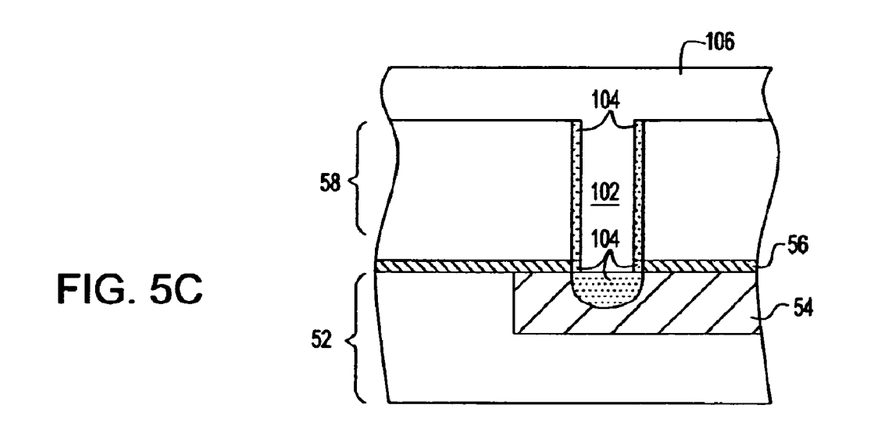
Figure 5D:
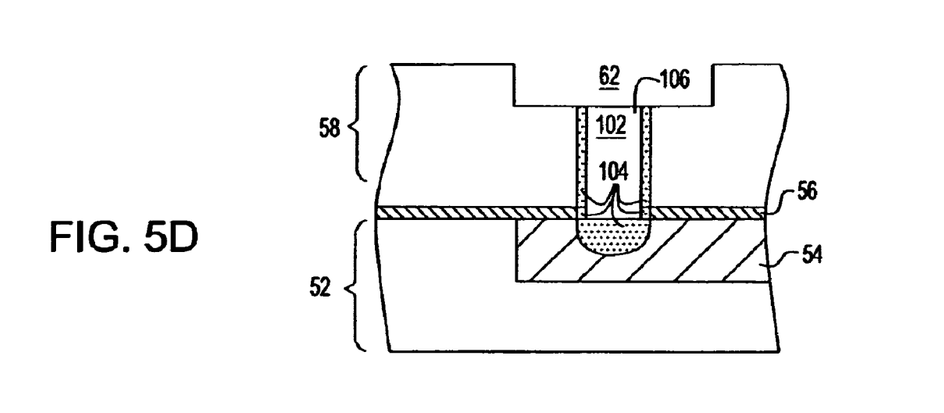

Next, and as shown in FIG. 5C, an organic or semi-organic planarizing dielectric 106 is formed within the opening 102 and atop an exposed surface of the upper ILD 58. Examples of organic or semi-organic planarizing dielectric 106 that can be employed in the present invention include, but are not limited to: photoresist materials, silicate glasses, polyhydroxystyrenes, and other like dielectric materials that do not reactively damage the upper ILD 58. The organic or semi-organic planarizing dielectric 106 is formed utilizing a conventional deposition process such as, for example, CVD, PECVD, spin-on coating, evaporation and other like deposition processes.

Standard steps (i.e., lithography and etching) are used to define and etch a line opening 62 with an upper portion of the ILD 58. The etching used during this process removes the organic or semi-organic planarizing dielectric 106 from the upper portion of the ILD 58 as well. Note that organic or semi-organic planarizing dielectric 106 remains in a lower portion of the opened area 102. The resultant structure that is performing after performed these steps is shown, for example, in FIG. 5D.

Figure 5E:
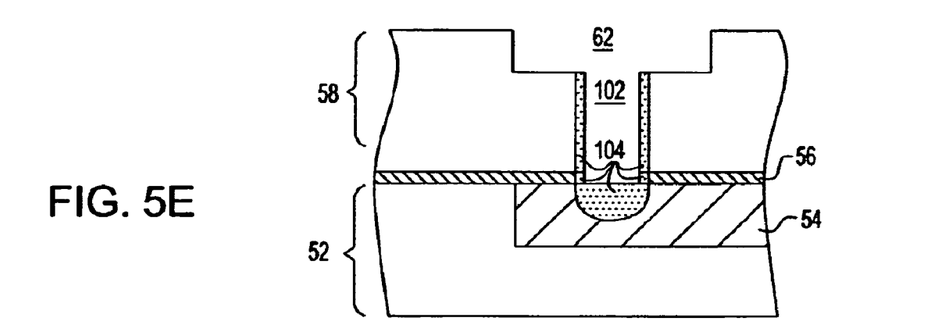

FIG. 5E shows the structure after the remaining planarizing dielectric 106 is removed from the opened area 102. The remaining planarizing dielectric 106 is removed utilizing an etchant that selectively removes the remaining planarizing dielectric 106 from the structure. One example of an etchant that can be used to selective remove the remaining planarizing dielectric 106 from the structure is AZ400T. Alternatively, the remaining planarizing dielectric 106 can be removed from the structure using thermal means. This embodiment is applicable when the planarizing dielectric 106 is comprised of a dielectric material that decomposes at elevated temperatures on the order of about 250° C. or greater. A yet other means for removing the remaining planarizing dielectric 106 is by utilizing an oxidative method. When an oxidative method is used, however, the exposed bottom of the line opening 62 cannot be detrimentally oxidized. In such instances, a buried hardmask (not shown) may be employed as an etch stop layer at the bottom of the line opening 62.

Figure 5F:
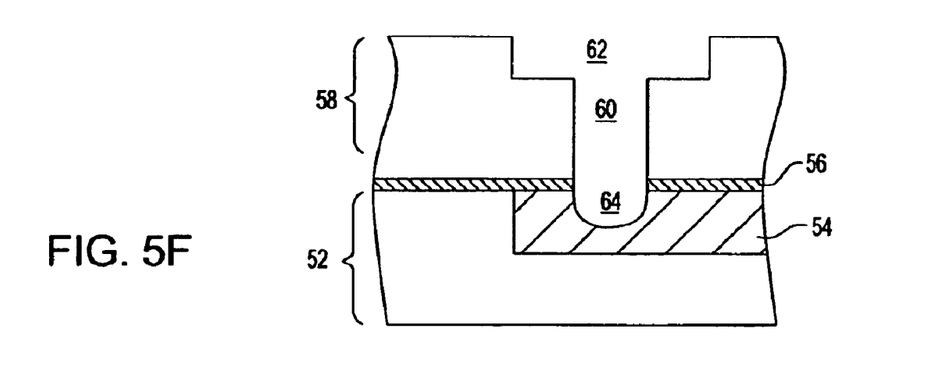

Next, and as shown in FIG. 5F, an etchant or etchants are used to selectively remove the remaining oxidized areas 104 from the structure. This creates an anchoring recessed area 64 below the first dielectric cap 56, which has minimized undercut. The etchant (or etchants) used in this step of the present invention comprises an etchant that selectively removes oxide from the structure. For example, HF or ammonium biflouride could be used to remove the remaining oxidized areas 104 from the structure. The removal of the oxidized area 104 from the lower portion of the ILD 58 within the previous defined opened area 102 provides the via opening 60 in a lower portion of the ILD 58.

Figure 5G:
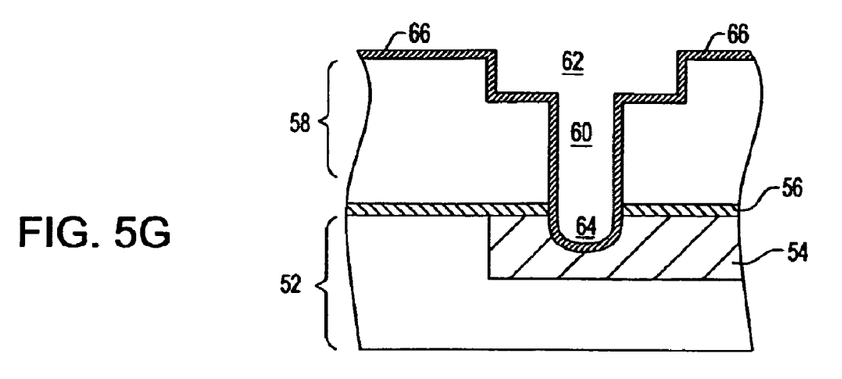

FIG. 5G shows the structure after liner 66 has been deposited. In this case, the liner coverage is continuous within the anchoring recessed area 64 as well as sidewalls of the ILD 58 within the via opening 60 and the line opening 62. The liner 66 is formed as described above and it is comprised of one of the materials mentioned above in the first embodiment of the present invention.

Figure 5H:
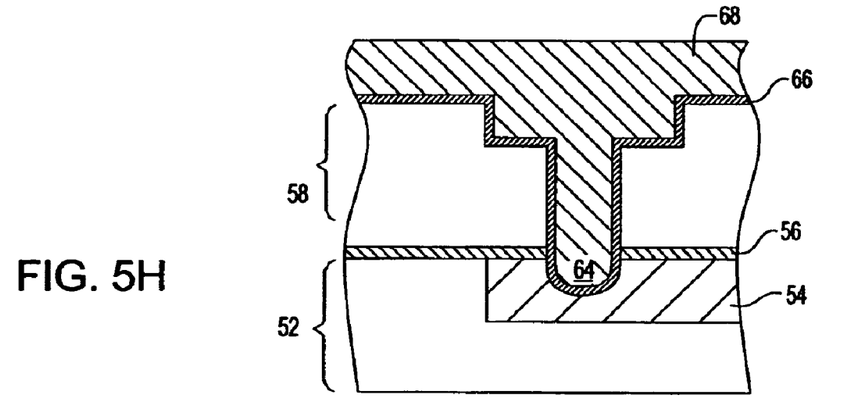

FIG. 5H shows the structure after the conductive material 68 has been deposited. The conductive material 68 is comprised of one of the conductive materials described above in the first embodiment and it is deposited utilizing one of the deposition techniques mentioned above as well.

Figure 5I:
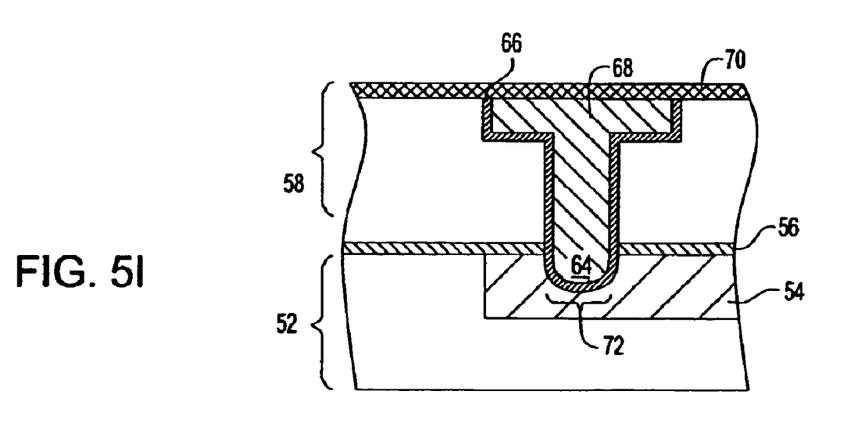

FIG. 5I shows the structure after planarization and forming a second dielectric cap 70 atop the exposed surfaces of the upper ILD 58 and the conductive material 68. The second dielectric cap 70 comprises one of the dielectric materials as mentioned above in the first embodiment and it is formed utilizing one of the above-mentioned techniques. Note that in this structure the metallic anchored via 72 includes a continuous liner 66 on the etched metal line 54.

The above steps may also be repeated to provide additional interconnect levels to the structure shown in FIG. 5I.

Figure 6A:
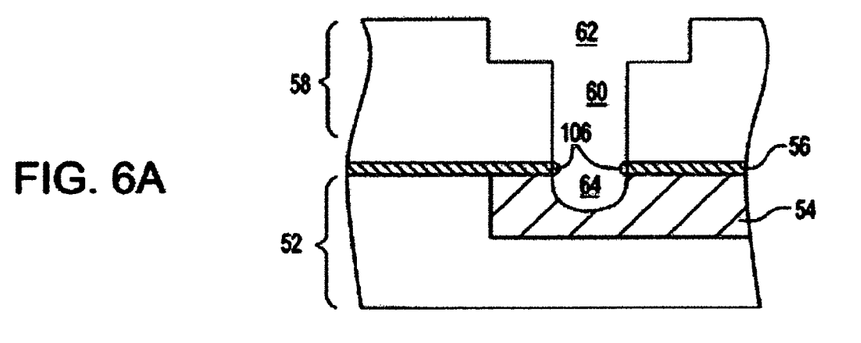
FIGS. 6A-6C are pictorial representations (through cross sectional views) depicting a fifth embodiment of the present invention.

In an analogous manner to the construction illustrated in FIGS. 5A-5I and alternate structure can be produced. In this fifth embodiment, the structure is built in the same manner as the fourth embodiment up until the step illustrated by FIG. 5F, this deviation is shown in FIG. 6A where some remaining cap structure (106) protrudes into the area that is to be subsequently filled with metal.

Figure 6B:
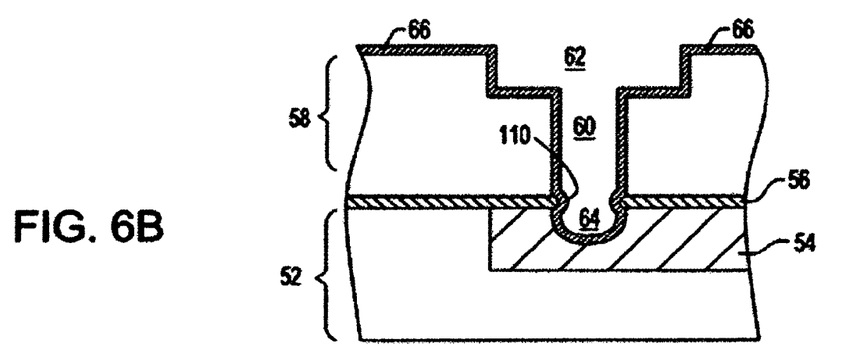

FIG. 6B illustrates the resultant structure post liner and seed deposition. The liner and seed project into the opening (110) in a conformal manner but need not be continuous as long as the IR drop is conducive to reliable filling of this structure during the subsequent metallization.

Figure 6C:
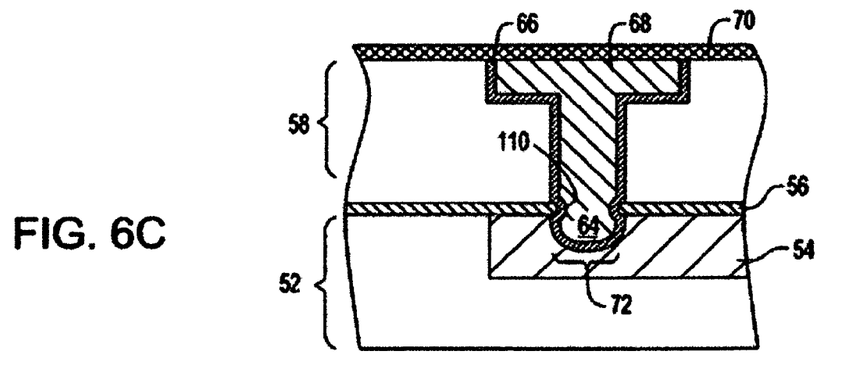

The process then is carried on in an analogous manner to forth embodiment and produces the resultant structure as illustrated by FIG. 6C. Note the projection into the metal filled cavity at point 110 that is a variation from that illustrated in FIG. 5I While the present invention has been particularly shown and described with respect to preferred embodiments thereof, it will be understood by those skilled in the art that the foregoing changes in forms and details may be made without departing from the spirit and scope of the present application. It is therefore intended that the present invention not be limited to the exact forms and details described and illustrated herein, but fall within the scope of the appended claims.

What is claimed is:

1. A method of forming a semiconductor interconnect structure comprising:

providing a structure comprising a lower interlevel dielectric having at least one metal line embedded therein, a first dielectric cap having an opening exposing a surface of the at least one metal line located on said lower interlevel dielectric, and an upper interlevel dielectric on said first dielectric cap, said upper interlevel dielectric having an opened area vertically aligned with said opening of said first dielectric cap;

oxidizing said exposed surface of said at least one metal line, and exposed sidewalls of said first dielectric cap and said upper interlevel dielectric;

providing a planarizing dielectric material to said structure, said planarizing dielectric material filling said opened area;

providing a line opening in an upper portion of the upper interlevel dielectric by selectively removing portions of the planarizing dielectric material, the oxidized surface of the interlevel dielectric and the upper interlevel dielectric;

removing remaining planarizing dielectric material within said opened area;

removing any remaining oxidized surface of the interlevel dielectric and said first dielectric cap as well as the oxidized surface of the metal line whereby a via opening and an anchoring recessed area are formed;

providing a liner covering portions of the remaining metal line within said anchoring recessed area; and filling said at least one line opening, said at least one via opening and said anchoring recessed area with a conductive material.

2. The method of claim 1 wherein said liner is sufficiently continuous.

3. The method of claim 1 wherein said oxidizing comprises an oxygen-containing plasma.

4. The method of claim 1 wherein said removing any remaining oxidized surface comprises a wet chemical etching process.

5. The method of claim 1 wherein said removing remaining planarizing dielectric material within said opened area comprises a wet chemical etching process, thermal decomposition or an oxidative method.

6. The method of claim 1 wherein said metal line comprises Cu.

7. The method of claim 1 wherein said opened area has a width that is smaller than a width of the via opening.

* * * * *